United States Patent
Hasegawa et al.

(10) Patent No.: US 6,310,488 B1
(45) Date of Patent: Oct. 30, 2001

(54) SUPERCONDUCTIVE SINGLE FLUX QUANTUM LOGIC CIRCUIT

(75) Inventors: Haruhiro Hasegawa, Funabashi; Yoshinobu Tarutani, Kokubunji; Tokuumi Fukazawa, Tachikawa; Kazumasa Takagi, Hinode, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/451,910

(22) Filed: Dec. 1, 1999

(30) Foreign Application Priority Data

Dec. 2, 1998 (JP) .................................................. 10-342429

(51) Int. Cl.[7] .......................... H03K 19/195; H03K 17/92
(52) U.S. Cl. ..................................... 326/6; 326/3; 327/367
(58) Field of Search ....................... 326/3, 6, 7; 327/367, 327/528

(56) References Cited

U.S. PATENT DOCUMENTS

| | | | |
|---|---|---|---|
| 4,342,924 | * 8/1982 | Howard et al. | 327/367 |
| 4,785,426 | * 11/1988 | Harada et al. | 365/162 |
| 5,162,298 | * 11/1992 | Chaudhari et al. | 505/162 |
| 5,233,244 | * 8/1993 | Suzuki | 326/4 |
| 5,831,278 | * 11/1998 | Berkowitz | 257/31 |

FOREIGN PATENT DOCUMENTS

363280474A * 11/1988 (JP).
410269783A * 10/1998 (JP).

OTHER PUBLICATIONS

IEEE Transactions on Applied Superconductivity, vol. 1, No. 2, Jun., 1991, "Quantum Flux Parametron: A Single Quantum Flux Device for Josephson Supercomputer", M. Hosoya et al, pp. 77–89.

* cited by examiner

Primary Examiner—Michael Tokar
Assistant Examiner—James Cho
(74) Attorney, Agent, or Firm—Mattingly, Stanger & Malur, P.C.

(57) ABSTRACT

In a superconductive single flux quantum logic circuit having two superconductive closed loops each comprising a Josephson junction and one or more inductors, a load inductance part is comprised of an inductor and a Josephson junction and two or more means for supplying a signal current are included. The load inductance part is made by one or more inductors and means for applying flux via the inductors is included.

3 Claims, 7 Drawing Sheets

SUPERCONDUCTIVE SINGLE FLUX QUANTUM LOGIC CIRCUIT

BACKGROUND OF THE INVENTION

The present invention relates to a configuration of a superconductive logic circuit using a single flux quantum as an information binary digit.

The configuration of a superconductive logic circuit using a single flux quantum as an information binary digit is described in IEEE Transactions on Applied Superconductivity vol. 1 (1991) pp. 77–89.

SUMMARY OF THE INVENTION

In a single flux quantum logic circuit, it is necessary to set the inductance of a superconductive closed loop to tens pH or smaller for circuit operation and it is also necessary to set the load inductance to tens pH or smaller in order to obtain a large output current. In order to supply an output signal of a single flux quantum logic circuit to a single flux quantum logic circuit at the next stage, a load inductance part has to be taken out of the superconductive closed loop. As shown in FIG. 1 in the above literature, the single flux quantum logic circuit generally includes only one means for applying flux to the superconductive closed loop and the load inductance part is positioned inside of the superconductive closed loop in order to reduce the inductance. When the load inductance part is taken to the outside of the superconductive closed loop, as shown in FIG. 4 of the literature, since superconductive wires cross each other, a problem such that the fabrication process becomes difficult occurs. Since the wire becomes longer, the inductance increases. Consequently, a problem such that the margin of the circuit operation decreases and the output current becomes smaller occurs.

Further, in order to construct a logic circuit, a sequential circuit is necessary. In the conventional technique, as shown in FIG. 16 of the literature, a shift register as one of sequential circuits is fabricated by using a multi-phase clock. In the multi-phase clock, however, signals are transmitted and received at overlapped parts of clocks. Consequently, a problem such that the timings of the clocks have to be accurately provided arises.

In order to solve the problems, it is an object of the invention to provide a structure which can realize a flip-flop circuit as a basic element of a sequential circuit without using a multi-phase clock and take a load inductance part out of a superconductive closed loop without increasing the inductance.

The invention is realized by a structure in which a load inductance part of the superconductive logic circuit having two superconductive closed loops each comprising a Josephson junction and one or more inductor(s) has at least an inductor and a Josephson junction.

DESCRIPTION OF THE PREFERRED EMBODIMENTS

Embodiments of the invention will be described hereinbelow. A first embodiment will be described by using FIGS. 1, 2, 3, and 4(a) to 4(e). The embodiment relates to an example of fabricating a flip-flop circuit as a basic element of a sequential circuit by using a QFP (Quantum Flux Parametron) as a single flux quantum logic circuit. As a superconductor, an oxide superconductor is employed.

Figure 1:
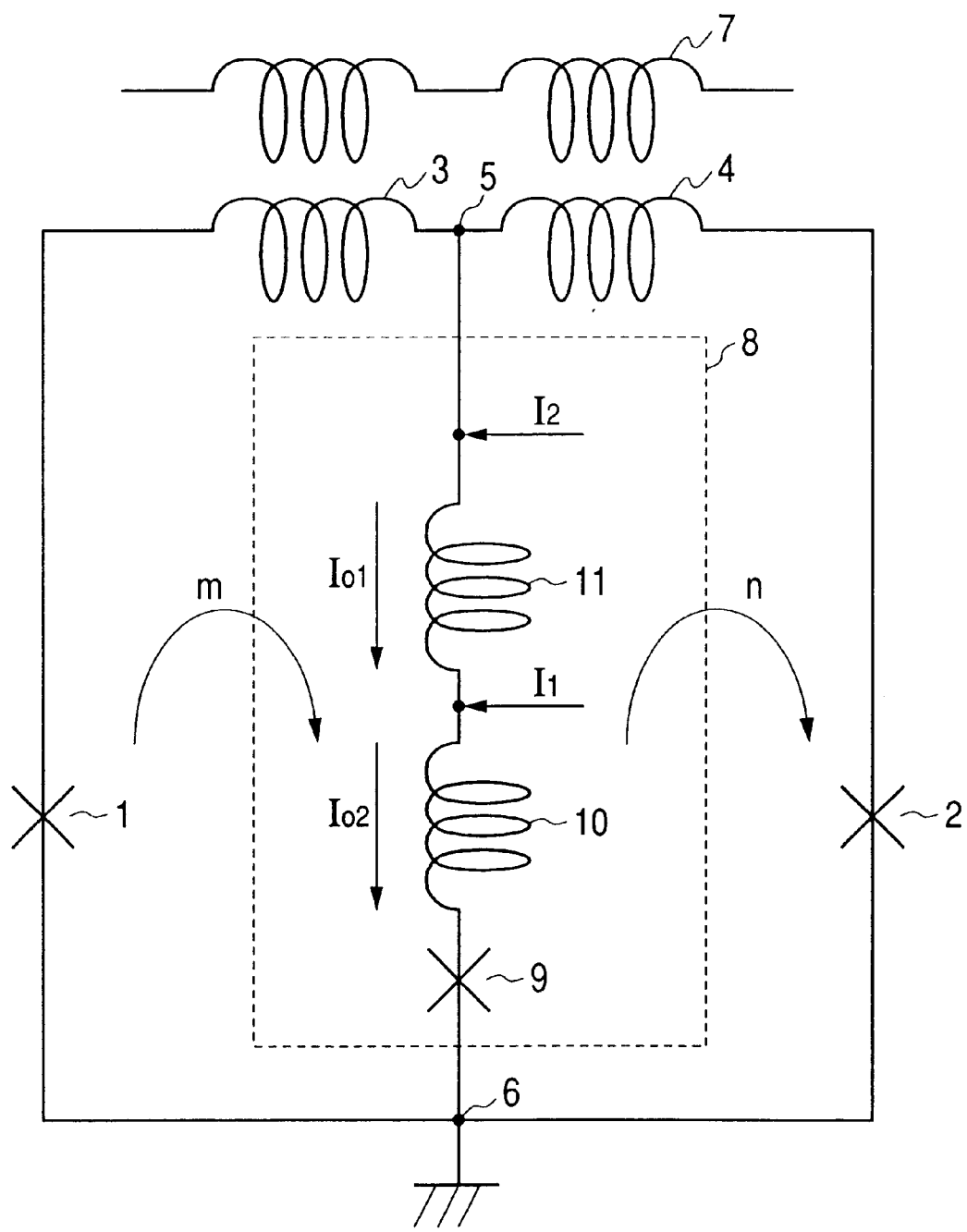
FIG. 1 is a diagram showing an equivalent circuit of a superconductive single flux quantum logic circuit of a first embodiment of the invention.

The circuit configuration is shown in FIG. 1. A QFP comprises a superconductive closed loop constructed by a first Josephson junction 1, a first inductor 3, and a load inductance part 8, a superconductive closed loop constructed by a second Josephson junction 2, a second inductor 4, and the load inductance part 8, and an inductor 7 as means for applying flux to the superconductive loops via the inductors 3 and 4. The load inductance part 8 is shared by the two superconductive closed loops.

The logic value of the QFP is determined by the number of flux quanta stored in the superconductive closed loops. When it is assumed that the number of flux quanta stored in the superconductive closed loop constructed by the first Josephson junction 1, first inductor 3 and load inductance part 8 is (m) and the number of flux quanta stored in the superconductive closed loop constructed by the load inductance part 8, second inductor 4, and second Josephson junction 2 is (n), (m, n)=(1, 0) corresponds to the logic value 1 of the QFP and (m, n)=(0, 1) corresponds to the logic value 0.

In the conventional QFP, the load inductance part 8 is formed only by inductors and an activation current as a clock is supplied to the inductor 7 and an input current is supplied to a connection point 5. When the activation current is set to zero, the output current becomes almost zero, so that information of an input signal cannot be held and the QFP cannot be used as a sequential circuit.

On the contrary, in the embodiment, the load inductance part 8 is constructed by a series circuit of inductors 10 and 11 and a third Josephson junction 9 and circuit means for supplying a first signal current $I_1$, and a second signal current $I_2$ to the inductors 10 and 11, respectively. Consequently, information of an input signal can be held and a flip-flop circuit as a basic element of the sequential circuit can be realized.

Figure 2:
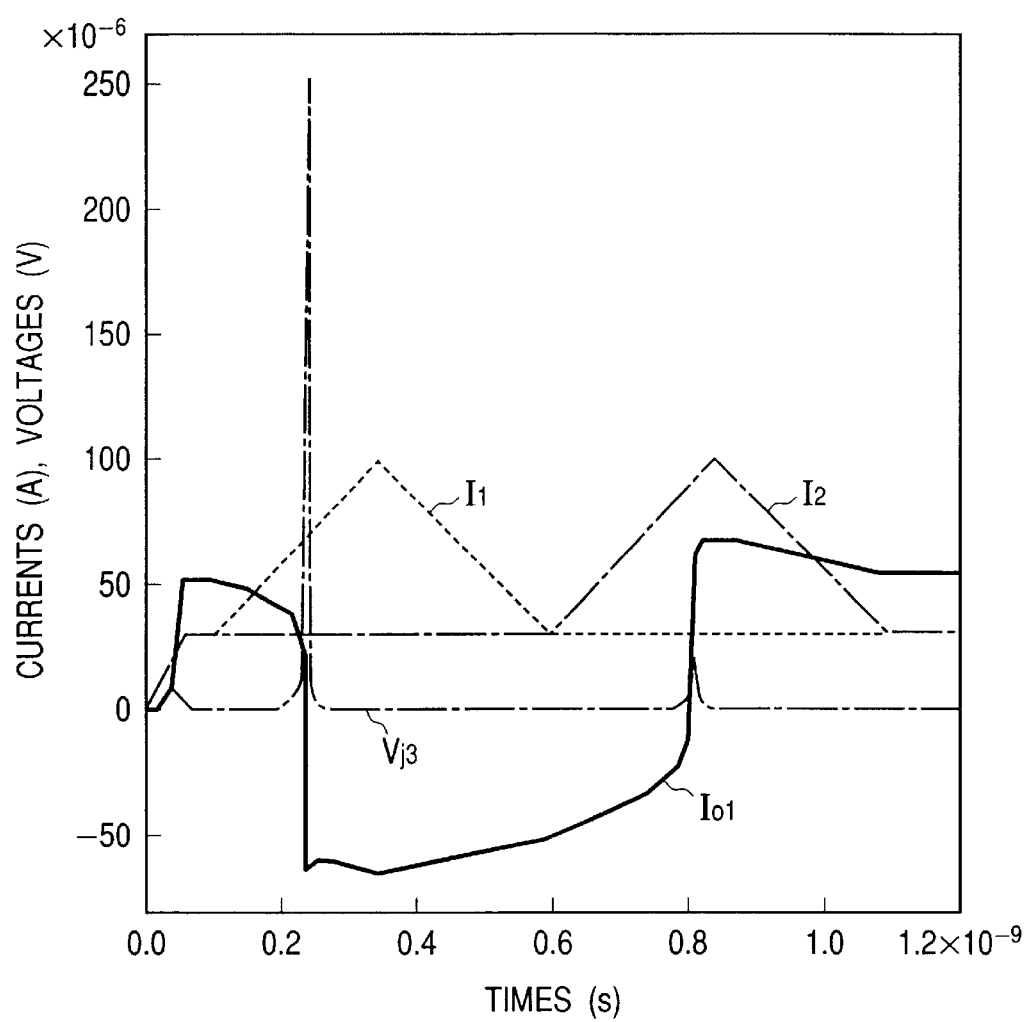
FIG. 2 is a diagram showing an operation waveform of the superconductive single flux quantum logic circuit of the first embodiment of the invention.
Figure 3:
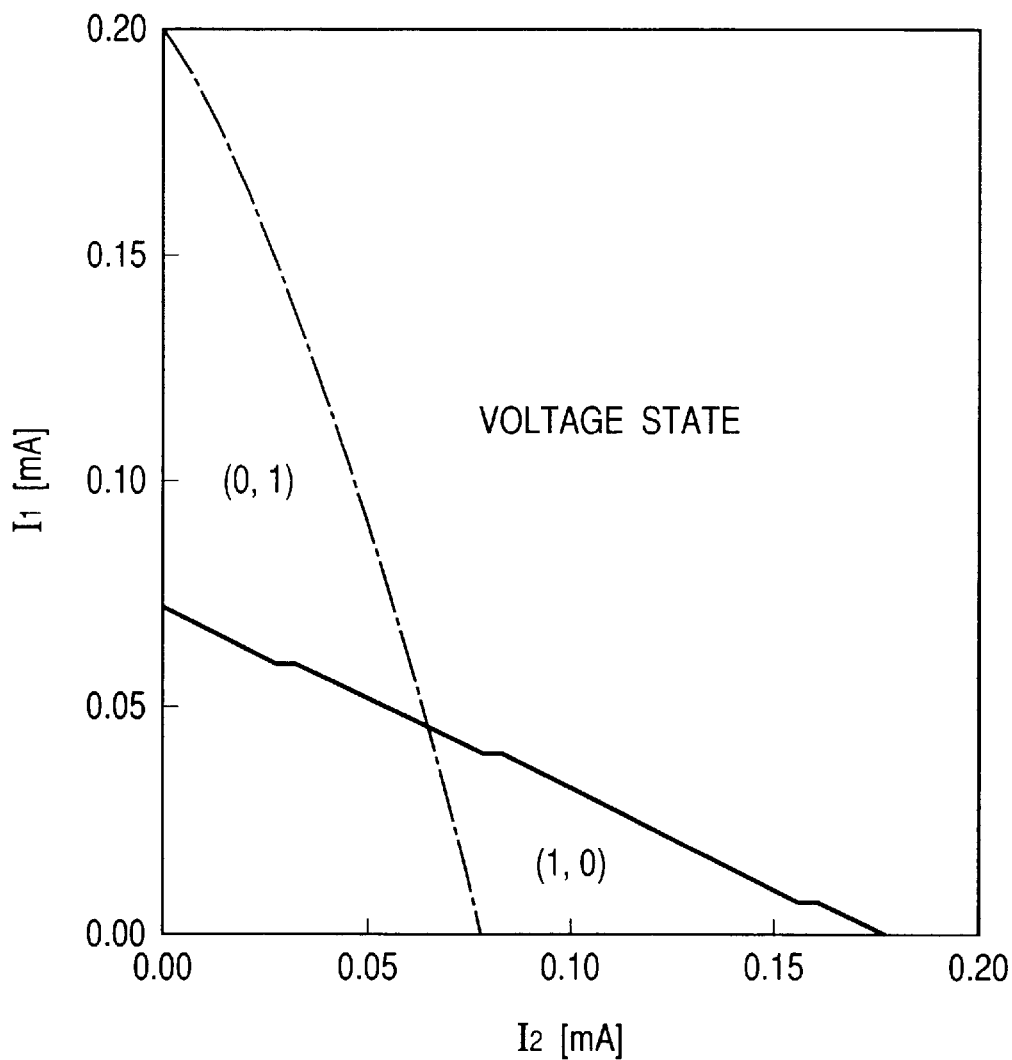
FIG. 3 is a diagram showing an operating state of the superconductive single flux quantum logic circuit of the first embodiment of the invention.

The circuit operation will be described with reference to FIGS. 2 and 3. Circuit parameters of the embodiment are as follows. The critical current $I_c$ of the Josephson junctions 1 and 2 is 0.05 mA, an inductance L of each of the inductors 3 and 4 is 5 pH, the critical current $I_c$ of the Josephson junction 9 is 0.1 mA, and inductances L of the inductors 10 and 11 are 1 pH and 9 pH, respectively. A constant bias current is applied to the inductor 7. FIG. 2 shows an operation waveform and FIG. 3 shows an operating state of the QFP. The operating state of the QFP can be expressed by the numbers (m, n) of flux quanta stored in the two superconductive closed loops. FIG. 3 shows the dependency on the first signal current $I_1$ and the second signal current $I_2$ of (m, n).

In FIG. 2, $I_{01}$ represents a current passing through the inductor 11 and $V_{J3}$ denotes a voltage applied to the Josephson junction 9. The current $I_{01}$ passing through the inductor 11 and the voltage $V_{J3}$ applied to the Josephson junction 9 are shown. When the signal currents I and $I_2$ are increased little by little from 0 to $30 \times 10^{-6}$ (A) in a period from 0 to $0.05 \times 10^{-9}$ seconds, only the signal current $I_1$ is once increased to $100 \times 10^{-6}$ (A) and then returned to the original value in a period from $0.1 \times 10^{-9}$ to $0.6 \times 10^{-9}$ seconds. Similarly, only the signal current $I_2$ is once increased and then returned to the original value in a period from $0.6 \times 10^{-9}$ seconds to $1.1 \times 10^{-9}$ seconds. After that, the signal currents $I_1$ and $I_2$ are maintained at $30 \times 10^{-6}$ (A) which is the same as that before increase.

It is understood from FIGS. 2 and 3 that when the first and second signal currents $I_1$ and $I_2$ are small, $I_{01}$ is a positive value and the QFP is in the (1, 0) state. When $I_1$ increases and exceeds a threshold value, $I_{01}$ rapidly becomes a negative value and the QFP is transitioned to the (0, 1) state. At this time, $V_{J3}$ has a sharp pulse waveform which corresponds to a change in the numbers (m, n) of the flux quanta. The reason why the state transition occurs in the QFP is because there is the third Josephson junction 9 in the load inductance part 8. Specifically, a current ($I_{02}$) which is the sum of $I_1$ and $I_{01}$ is passed to the Josephson junction 9. When the current exceeds the critical current, the junction is transitioned to a voltage state and the state transition in the QFP occurs.

After that, even when $I_1$ decreases and is returned to the original value, $I_{01}$ is still a negative value and the state remains at (0, 1) and is held. Subsequently, when $I_2$ increases and exceeds a threshold value, $I_{01}$ becomes positive and the QFP is shifted to the (1, 0) state. At this time as well, $V_{J3}$ has a sharp pulse waveform which corresponds to the change in the numbers (m, n) of the flux quanta. The state transition of the QFP occurs due to the first and second Josephson junctions 1 and 2. Specifically, a current obtained by subtracting $I_{01}$ from $I_2$ is passed to the Josephson junctions 1 and 2. When the current exceeds the critical current, the junction shifts to a voltage state and the state transition in the QFP occurs. After that, when $I_2$ decreases and is returned to the original value, $I_{01}$ is still a positive value and the state remains at (1, 0). Similarly, the state is held.

By making I and $I_2$ correspond to a setting signal and a resetting signal, respectively, a flip flop can be realized. In the embodiment, a constant bias current is just applied to the inductor 7 and a multi-phase clock is not used. A flip flop can be therefore realized without considering the problem of the timing of the clock.

The conventional QFP has a configuration that the Josephson junction is not included in the load inductance part 8. The state of the QFP does not therefore transition between (1, 0) and (0, 1) in accordance with the values $I_1$ and $I_2$, so that a flip flop operation with respect to $I_1$ and $I_2$ cannot be realized.

Figure 4A:
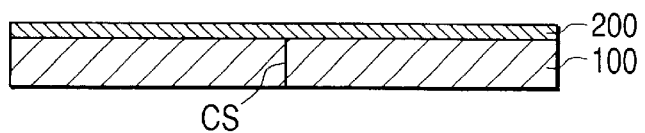
FIGS. 4(a) to 4(e) E are diagrams showing a fabricating process of the superconductive single flux quantum logic circuit of the first embodiment of the invention and arrangement of circuits seen from above of the fabricated superconductive single flux quantum logic circuit.
Figure 4B:
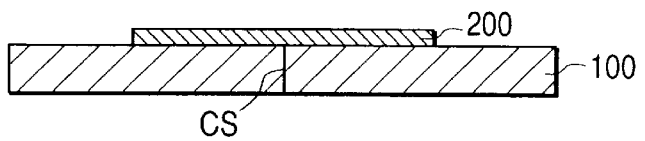
Figure 4C:
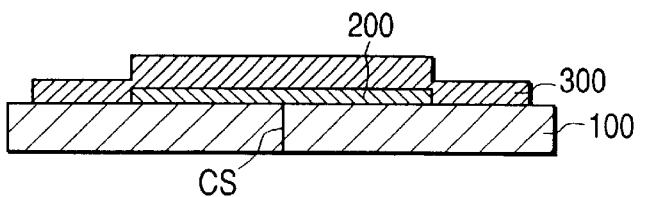
Figure 4D:
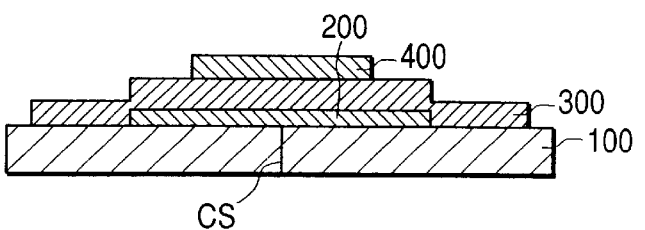

A process of fabricating a flip flop circuit of the embodiment will be described with reference to cross sections of FIGS. 4(a) to 4(d). As shown in FIG. 4(a), an oxide superconductor $YBa_2Cu_3O_7$ film 200 is deposited by laser deposition on the top face of an $SrTiO_3$ bicrystal substrate 100 having a junction face CS. As shown in FIG. 4(b), a predetermined pattern is formed in the $YBa_2Cu_3O_7$ film 200 by electron beam lithography and Ar ion etching. Further, as shown in FIG. 4(c), an $SrTiO_3$ film 300 is deposited as an insulating interlayer by laser deposition. Further, as illustrated in FIG. 4(d), an Au film 400 is deposited by a resistance heating evaporation method and formed in a predetermined pattern by electron beam lithography and Ar ion etching, thereby fabricating a desired QFP.

Figure 4E:
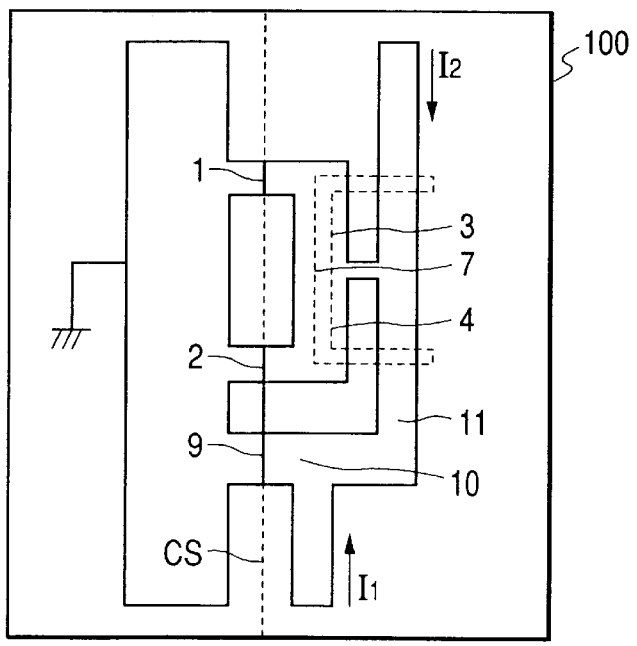

FIG. 4(e) shows an arrangement of circuits seen from above of the fabricated QFP. The Josephson junctions 1 and 2, the inductors 3 and 4, and the load inductance part 8 comprised of the inductors 10 and 11 and the third Josephson junction 9 are formed at the time of patterning the $YBa_2Cu_3O_7$ film 200 in FIG. 4(b). At this time, a Josephson junction is formed in a position corresponding to the junction face CS of the $SrTiO_3$ bicrystal substrate 100 shown by a broken line. The two signal currents $I_1$ and $I_2$ are passed as shown by arrows in the diagram. The inductor 7 is formed at the time of patterning the Au film 400 in FIG. 4(d). In the diagram, the inductor 7 is shown by broken lines so as to be easily distinguished from the other circuit part. In order to apply flux to the superconductive closed loop comprised of the Josephson junctions 1 and 2 and the inductors 3 and 4, the inductor 7 is formed in the position corresponding to the inductors 3 and 4. As shown in the equivalent circuit of FIG. 1, the common part of the circuit at the left end in FIG. 4(e) is connected to the ground. The wiring for this arrangement is omitted in the diagram.

Figure 5A:
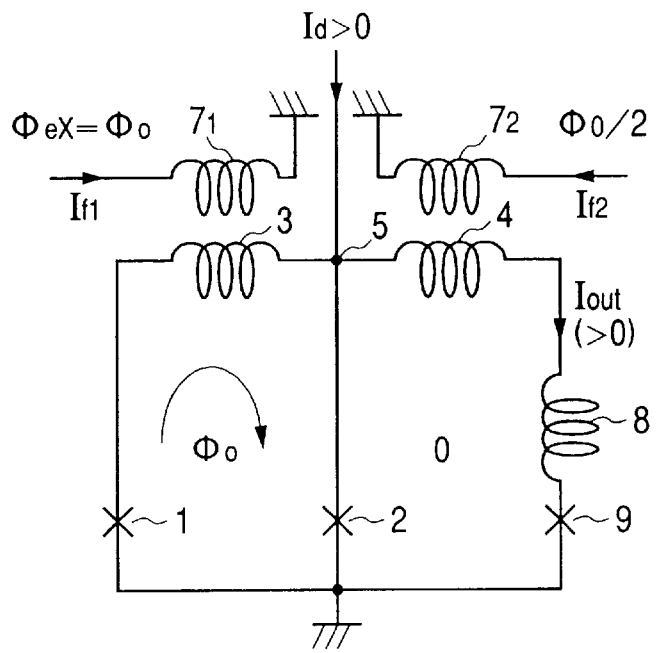
FIGS. 5(a) and 5(b) are diagrams each showing an equivalent circuit of the superconductive single flux quantum logic circuit of a second embodiment of the invention.
Figure 5B:
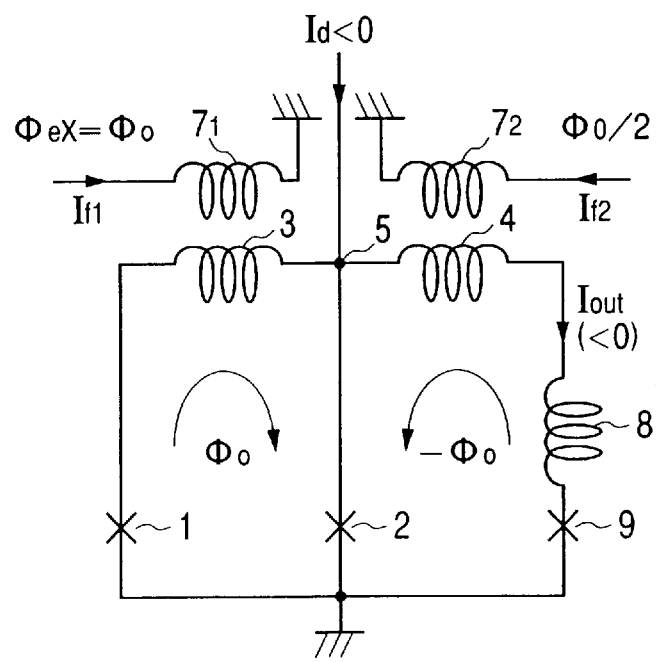
Figure 6:
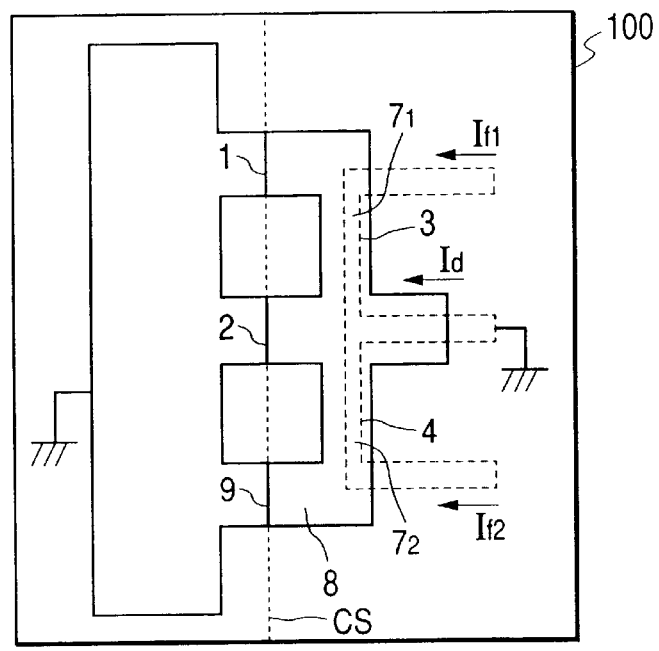
FIG. 6 is a diagram showing arrangement of circuits from above of the superconductive single flux. quantum logic circuit of the second embodiment of the invention.

A second embodiment of the invention in which the load inductance part is taken out of the superconductive closed loop without increasing the inductance in the QFP as a single flux quantum logic circuit by paying attention to the configuration that the load inductance part has at least the inductor and the Josephson junction will be described by using FIGS. 5(a) and 5(b) showing the equivalent circuit and FIG. 6 showing the circuit arrangement.

The embodiment of FIGS. 5(a) and 5(b) comprises a superconductive closed loop constructed by the first Josephson junction 1, the first inductor 3, and the second Josephson junction 2, the superconductive closed loop constructed by the second Josephson junction 2, the second inductor 4, the load inductance part 8, and the third Josephson junction 9, and two inductors $7_1$ and $7_2$ as means for applying flux to the superconductive closed loops via the inductors 3 and 4. The second Josephson junction 2 is shared by the two superconductive closed loops. In the embodiment, it is unnecessary to divide the load inductance part 8 into the inductors 10 and 11.

Elements designated by the same reference numerals as those in FIG. 1 are equivalents. Although the same activation current is supplied to the inductors 3 and 4 in FIG. 1, activation currents $I_{f1}$ and $I_{f2}$ are supplied to the inductors $7_1$ and $7_2$, respectively, and it is set so that external flux $\Phi_0$ is applied to the first superconductive closed loop and external flux $-\Phi_0/2$ is applied to the second superconductive closed loop. As a result, the flux quanta of the loops become as shown in the diagram in accordance with the polarity of the input signal current $I_d$ and the polarity of the output current $I_{out}$ passing through the load inductance part 8 becomes as shown in the diagram.

The fabricating process of the embodiment shown in FIGS. 5(a) and 5(b) is similar to the first embodiment shown in FIGS. 4(a) to 4(d) as easily understood from the comparison between FIGS. 1 and 5(a) and 5(b). FIG. 6 is a diagram showing the arrangement of circuits seen from above of the fabricated QFP. The superconductive closed loop is formed by the Josephson junctions 1 and 2 and the inductor 3 and the superconductive closed loop is formed by the Josephson junctions 2 and 9 and the inductors 4 and 8. The inductors $7_1$ and $7_2$ are magnetically connected to the inductors 3 and 4 and apply flux to the superconductive closed loops. Since the load inductance part 8 is one of elements of the superconductor closed loop and is taken out of the superconductive closed loop, an output signal of the QFP can be easily supplied to the QFP at the next stage. A signal current $I_d$ is supplied from the connection point 5. The inductors $7_1$ and $7_2$ are magnetically connected to the inductors 3 and 4 and apply the flux. By passing the activation currents to the inductors $7_1$ and $7_2$ so that the flux applied by the inductor $7_1$ via the inductor 3 is a flux quantum and the flux applied by the inductor $7_2$ via the inductor 4 is $-1/2$ flux quantum, the QFP operation can be obtained.

As described above, in the embodiment, the load inductance part can be taken out of the superconductive closed loop without crossing the superconductive wires or making the wiring longer. Thus, the QFP capable of outputting a large current and easily supplying an output signal to the next stage can be realized. In order to supply the output signal to the next stage, it is sufficient to place an input inductor at the next stage which is magnetically connected to the load inductance part 8 by the side.

Figure 7:
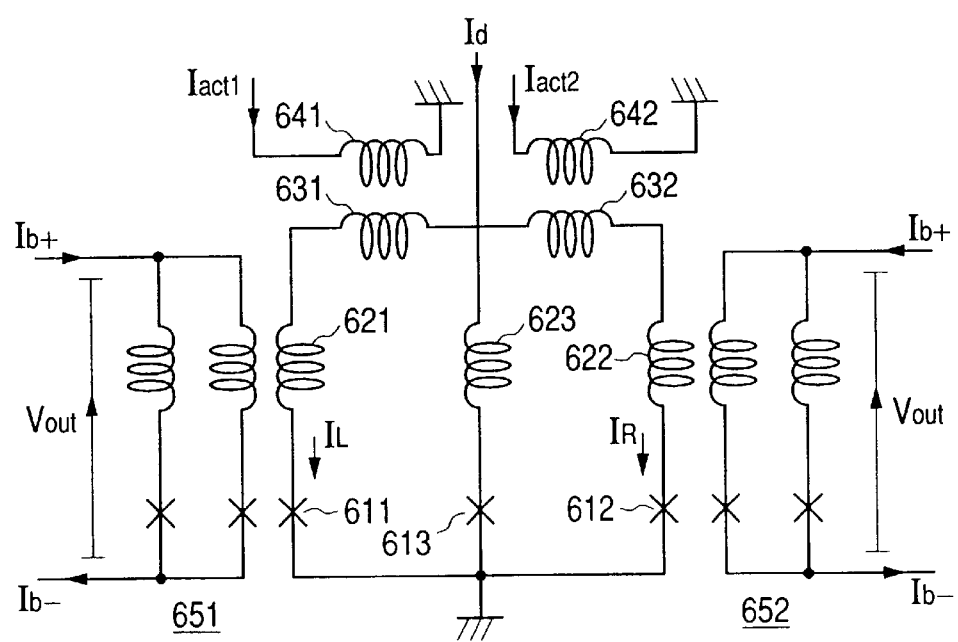
FIG. 7 is a diagram showing an equivalent circuit of a demultiplexer of a third embodiment of the invention.

A third embodiment of the invention will now be described with reference to FIGS. 7 and 8. The embodiment relates to a case of fabricating a 1:2 demultiplexer (DMUX) by using the QFP of the second embodiment. An equivalent circuit is shown in FIG. 7. Flux is applied by an inductor 641 through which a current $I_{act1}$ is passed to a superconductive closed loop comprised of Josephson junctions 611 and 613 and inductors 621, 631, and 623. Flux is applied by an inductor 642 through which a current $I_{act2}$ is passed to a superconductive closed loop comprised of Josephson junctions 613 and 612 and inductors 623, 632, and 622. A current $I_L$ passing through the inductor 621 is detected by a superconducting quantum interference device 651 and a current $I_R$ passing through the inductor 622 is detected by a superconducting quantum interference device 652. Since the inductors 621 and 622 are formed on the outer sides of the superconductive closed loops, the superconducting quantum interference devices 651 and 652 can be arranged so as to be magnetically connected to the inductors 621 and 622 without crossing wires.

Figure 8:
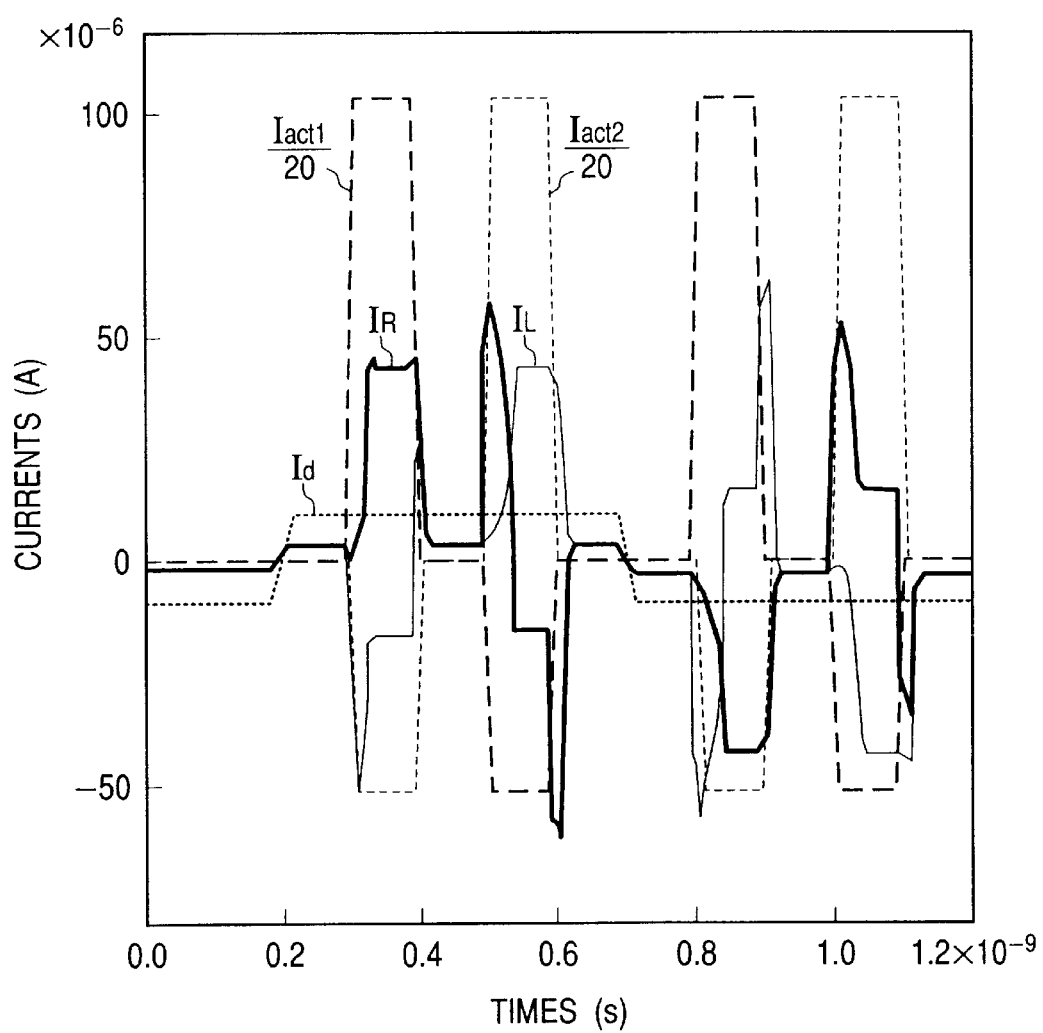
FIG. 8 is a diagram showing an operation waveform of the demultiplexer of the third embodiment of the invention.

FIG. 8 shows the operational waveform. When the currents $I_{act1}$ and $I_{act2}$ are passed to the inductors 641 and 642 so that one flux quantum is applied by the inductor 641 and the $-1/2$ flux quantum is applied by the inductor 642, the inductors 622 and 632 and the Josephson junction 612 function as a load inductance part and the output current corresponding to the signal current $I_d$ flows in the inductor 622. Similarly, when the currents $I_{act1}$ and $I_{act2}$ are passed to the inductors 641 and 642 so that one flux quantum is applied by the inductor 642 and the $-1/2$ flux quantum is applied by the inductor 641, the inductors 621 and 631 and the Josephson junction 611 function as a load inductance part and the output current corresponding to the signal current $I_d$ flows in the inductor 621. In practice, as shown in FIG. 8, in the case where the signal current $I_d$ is positive, that is, the logic value is 1, when $I_{act1}=2.07$ mA and $I_{act2}=-1.035$ mA, $I_R$ becomes a sufficiently large positive value, that is, the logic value of 1. When $I_{act1}=-1.035$ mA and $I_{act2}=2.07$ mA, $I_L$ becomes a sufficiently large positive value, that is, a logic value of 1. In the case where the signal current $I_d$ is negative, that is, the logic value is 0, when $I_{act1}=2.07$ mA and $I_{act2}=-1.035$ mA, $I_R$ becomes a sufficiently large negative value, that is, the logic value of 0. When $I_{act1}=-1.035$ mA and $I_{act2}=2.07$ mA, $I_L$ becomes a sufficiently large negative value, that is, a logic value of 0. By the above, the correct operation can be confirmed. By using the currents $I_{act1}$ and $I_{act2}$ passing through the inductors 641 and 642 as selection signals, the logic value of the signal current can be outputted to the superconducting quantum interference device 651 or 652, thereby enabling a 1:2 demultiplexer to be obtained. In FIG. 8, the currents $I_{act1}$ and $I_{act2}$ are shown on the scale of 1/20.

As described above, the superconductive single flux quantum logic circuit of the invention has the configuration such that the load inductance part is comprised of at least the inductor and the Josephson junction, thereby enabling various circuits to be easily constructed.

What is claimed is:

1. The superconductive single flux quantum logic circuit comprising:

first and second Josephson junction elements connected in series to each other, first and second inductors connected in series to each other and each connected in series to a respective one of said first and second Josephson junction elements, said first and second inductors being magnetically coupled to a third inductor;

fourth and fifth inductors connected in series to each other, having a first end coupled to a first connecting point of said first and second Josephson junction elements and having a second end connected to a second connecting point of said first and second inductors;

a third Josephson junction element disposed between said first and second connecting points and connected in series to the serial connection of said fourth and fifth inductors;

a first terminal connected to a connecting point of said fourth inductor and said fifth inductor for injecting a first signal current as a setting signal or a resetting signal and a second terminal connected to a connecting point of the other end of said fifth inductor and the second connecting point of said first and second inductors for injecting a second signal current as a resetting signal or a setting signal;

whereby the superconductive single flux quantum logic circuit takes one of two different states according to adding of the setting signal and adding of the resetting signal respectively while said third inductor is provided a constant bias current.

2. The superconductive single flux quantum logic circuit comprising:

first and second Josephson junction elements connected in series to each other, first and second inductors connected in series to each other and each connected in series to a respective one of said first and second Josephson junction elements, said first and second inductors being magnetically coupled to a third inductor;

fourth and fifth inductors connected in series to each other, having a first end coupled to a first connecting point of said first and second Josephson junction elements and having a second end connected to a second connecting point of said first and second inductors;

a third Josephson junction element disposed between said first and second connecting points and connected in series to the serial connection of said fourth and fifth inductors;

a first terminal connected to a connecting point of said fourth inductor and said fifth inductor for injecting a predetermined current as a basic current and a second terminal connected to a connecting point of the other end of said fifth inductor and the second connecting point of said first and second inductors for injecting a signal current representing an output current;

whereby the predetermined current is set larger than the critical current of said first and second Josephson junction elements; and whereby the superconductive single flux quantum logic circuit generates a voltage output according to a polarity and largeness of the signal current while said third inductor is provided a constant bias current.

3. The superconductive single flux quantum logic circuit according to claim 2, wherein the current is used as a basic current and the current is used as a signal current.

* * * * *